United States Patent
Li et al.

(10) Patent No.: US 7,010,848 B2
(45) Date of Patent: Mar. 14, 2006

(54) SYNTHETIC PATTERN EXCHANGE CONFIGURATION FOR SIDE READING REDUCTION

(75) Inventors: Min Li, Fremont, CA (US); You Feng Zheng, San Jose, CA (US); Simon Liao, Fremont, CA (US); Kochan Ju, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 630 days.

(21) Appl. No.: 10/077,064

(22) Filed: Feb. 15, 2002

(65) Prior Publication Data

US 2003/0156361 A1   Aug. 21, 2003

(51) Int. Cl.
 G11B 5/39 (2006.01)
 G11B 5/33 (2006.01)
 G11B 5/127 (2006.01)

(52) U.S. Cl. ............... 29/603.14; 29/603.15; 29/603.07; 360/324.11; 360/324.12

(58) Field of Classification Search ............ None
See application file for complete search history.

(56) References Cited

U.S. PATENT DOCUMENTS

| | | | |
|---|---|---|---|
| 5,583,725 A * | 12/1996 | Coffey et al. | 360/324.11 |
| 5,920,446 A * | 7/1999 | Gill | 360/324 |
| 6,118,624 A | 9/2000 | Fukuzawa et al. | 360/113 |
| 6,222,707 B1 | 4/2001 | Huai et al. | 360/324.1 |
| 6,295,186 B1 * | 9/2001 | Hasegawa et al. | 360/324.11 |
| 6,322,640 B1 | 11/2001 | Xiao et al. | 148/308 |
| 6,324,037 B1 | 11/2001 | Zhu et al. | 360/324.12 |
| 6,473,279 B1 * | 10/2002 | Smith et al. | 360/324.12 |

* cited by examiner

*Primary Examiner*—William Korzuch
*Assistant Examiner*—Christopher R. Magee
(74) *Attorney, Agent, or Firm*—George D. Saile; Stephen B. Ackerman

(57) ABSTRACT

A patterned, synthetic, longitudinally exchange biased GMR sensor is provided which has a narrow effective trackwidth and reduced side reading. The advantageous properties of the sensor are obtained by satisfying a novel relationship between the magnetizations (M) of the ferromagnetic free layer (F1) and the ferromagnetic biasing layer (F2) which enables the optimal thicknesses of those layers to be determined for a wide range of ferromagnetic materials and exchange coupling materials. The relationship to be satisfied is $M_{F2}/M_{F1}=(J_s+J_{ex})/J_s$, where $J_s$ is the synthetic coupling energy between F1 and F2 and $J_{ex}$ is the exchange energy between F2 and an overlaying antiferromagnetic pinning layer. An alternative embodiment omits the overlaying antiferromagnetic pinning layer which causes the relationship to become $M_{F2}/M_{F1}=1$.

20 Claims, 8 Drawing Sheets

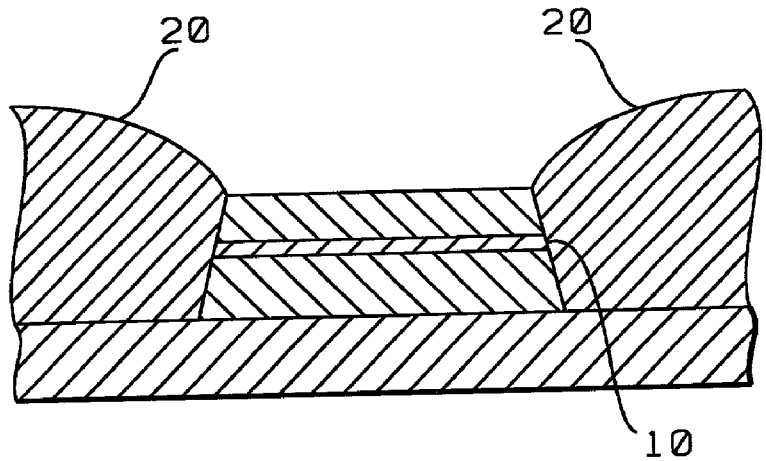
*FIG. 1 - Prior Art*
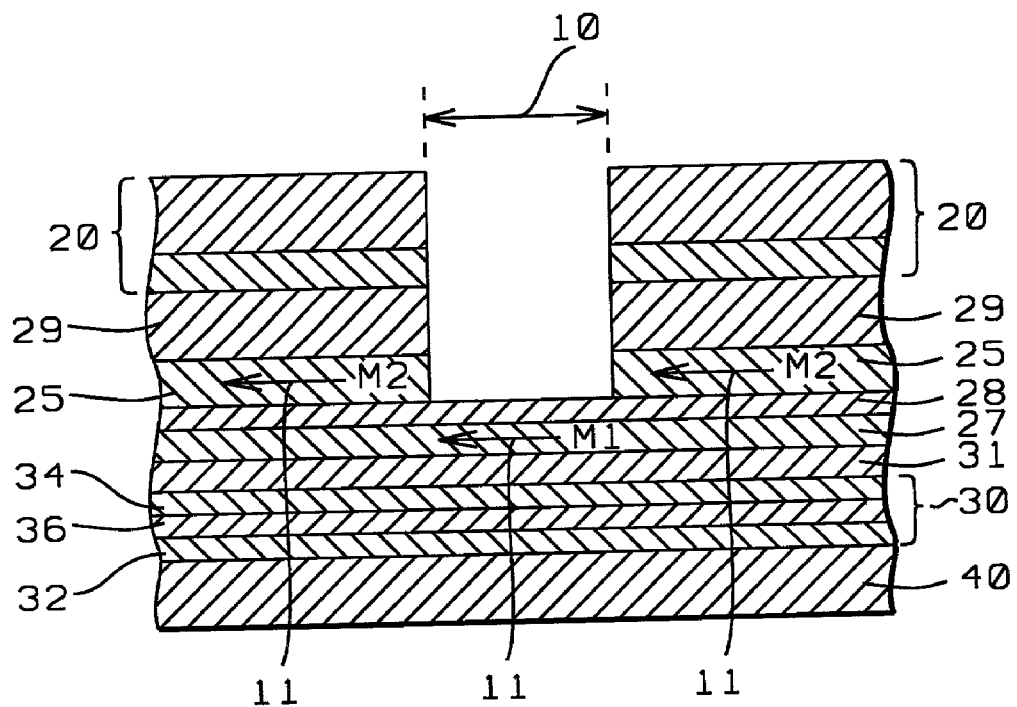
*FIG. 2 - Prior Art*

SYNTHETIC PATTERN EXCHANGE CONFIGURATION FOR SIDE READING REDUCTION

RELATED PATENT APPLICATION

This application is related to Ser. No. 10/091,959, filing date Mar. 6, 2002, to Ser. No. 10/104,482, filing date Mar. 22, 2002, and to Ser. No. 10/116,984, filing date Apr. 5, 2002, all assigned to the same assignee as the current invention.

BACKGROUND OF THE INVENTION

1. Field of the Invention

This invention relates generally to the fabrication of a giant magnetoresistive (GMR) magnetic field sensor for a magnetic read head, more specifically to the use of synthetic exchange biasing to reduce the magnetic track width (MRW) of such a sensor.

2. Description of the Related Art

Magnetic read heads whose sensors make use of the giant magnetoresistive effect (GMR) in the spin-valve configuration (SVMR) base their operation on the fact that magnetic fields produced by data stored in the medium being read cause the direction of the magnetization of one layer in the sensor (the free magnetic layer) to move relative to a fixed magnetization direction of another layer of the sensor (the fixed or pinned magnetic layer). Because the resistance of the sensor element is proportional to the cosine of the (varying) angle between these two magnetizations, a constant current (the sensing current) passing through the sensor produces a varying voltage across the sensor which is interpreted by associated electronic circuitry. The accuracy, linearity and stability required of a GMR sensor places stringent requirements on the magnetization of its fixed and free magnetic layers. The fixed layer, for example, has its magnetization "pinned" in a direction normal to the air bearing surface of the sensor (the transverse direction) by an adjacent magnetic layer called the pinning layer. The free layer is magnetized in a direction along the width of the sensor and parallel to the air bearing surface (the longitudinal direction). Layers of hard magnetic material (permanent magnetic layers) or laminates of antiferromagnetic and soft magnetic materials are typically formed on each side of the sensor and oriented so that their magnetic field extends in the same direction as that of the free layer. These layers, called longitudinal bias layers, maintain the free layer as a single magnetic domain and also assist in linearizing the sensor response by keeping the free layer magnetization direction normal to that of the fixed layer when quiescent. Maintaining the free layer in a single domain state significantly reduces noise (Barkhausen noise) in the signal produced by thermodynamic variations in domain configurations. A magnetically stable spin-valve sensor using either hard magnetic biasing layers or ferromagnetic biasing layers is disclosed by Zhu et al. (U.S. Pat. No. 6,324,037 B1) and by Huai et al. (U.S. Pat. No. 6,222,707 B1).

The importance of longitudinal bias has led to various inventions designed to improve the material composition, structure, positioning and method of forming the magnetic layers that produce it. One form of the present art provides for sensor structures in which the longitudinal bias layers are layers of hard magnetic material (permanent magnets) that abut the etched back ends of the active region of the sensor to produce what is called an abutted junction configuration. This arrangement fixes the domain structure of the free magnetic layer by magnetostatic coupling through direct edge-to-edge contact at the etched junction between the biasing layer and the exposed end of the layer being biased (the free layer). Another form of the present art, patterned exchange bias, appears in two versions: 1) direct exchange and 2) synthetic exchange. Unlike the magnetostatic coupling resulting from direct contact with a hard magnetic material that is used in the abutted junction, in exchange coupling the biasing layer is a layer of ferromagnetic material which overlays the layer being biased, but is separated from it by a thin coupling layer of non-magnetic material. This non-magnetic gap separating the two layers produces exchange coupling between them, a situation in which it is energetically favorable for the biasing layer and the biased layer assume a certain relative direction of magnetization. In direct exchange coupling, the material used to form the gap (eg. Cu or Ru) and its thickness are chosen to allow a ferromagnetic form of exchange coupling wherein the biasing and biased layers have the same directions of magnetization. In synthetic exchange coupling, the non-magnetic material of the coupling layer (eg. Cu, Ru or Rh) and its thickness are chosen to allow antiferromagnetic coupling, wherein the magnetization of the biasing and biased layers are antiparallel. Xiao et al. (U.S. Pat. No. 6,322,640 B1) disclose a method for forming a double, antiferromagnetically biased GMR sensor, using as the biasing material a magnetic material having two crystalline phases, one of which couples antiferromagnetically and the other of which does not.

As the area density of magnetization in magnetic recording media (eg. disks) continues to increase, significant reduction in the width of the active sensing region (trackwidth) of read-sensors becomes necessary. For trackwidths less than 0.2 microns ($\mu$m), the traditional abutted junction hard bias structure discussed above becomes unsuitable because the strong magnetostatic coupling at the junction surface actually pins the magnetization of the (very narrow) biased layer (the free layer), making it less responsive to the signal being read and, thereby, significantly reducing the sensor sensitivity. This adverse pinning effect is discussed by Fukuzawa et al. (U.S. Pat. No. 6,118,624) who provide a mechanism for alleviating it by use of a hard magnetic biasing film which has a higher saturation magnetism than the free layer being biased.

Under very narrow trackwidth conditions, the exchange bias method becomes increasingly attractive, since the free layer is not reduced in size by the formation of an abutted junction, but extends continuously across the entire width of the sensor element. FIG. 1 is a schematic depiction of an abutted junction arrangement and FIG. 2 is an equally schematic depiction of a direct exchange coupled configuration. As can be seen, the trackwidth in the abutted junction is made narrow by physically etching away both ends of the sensor, whereas in the exchange coupled sensor, the trackwidth is defined by placement of the conductive leads and bias layers while the sensor element retains its full width.

The direct exchange biasing also has its shortcomings when used in a very narrow trackwidth configuration because of the weakness of the pinning field, provided to the free and biasing layers by the antiferromagnetic layer, which pinning field is found to be, typically, approximately 250 Oe.

A stronger pinning field, typically exceeding 700 Oe, can be obtained using the synthetic exchange biasing method. Such a pinning field can be obtained, for example, using a GMR configuration (numerals referring to angstroms) with a CoFe (10)/NiFe(20) ferromagnetic free bilayer, a Ru (7.5) non-magnetic coupling layer and a CoFe (15) biasing layer antiferromagnetically pinned by an antiferromagnetic IrMn (40) layer. According to micromagnetic simulation, a magnetic trackwidth of 0.15 μm can be obtained with a physical track width of 0.1 μm by using such a configuration. Unfortunately, even with its higher degree of exchange coupling this configuration produces an undesirable level of side reading (sensor response generated by signals originating outside of the magnetic trackwidth region) which is produced by the portion of the free layer that is beneath the biasing layer and conduction leads.

The present invention, therefore, addresses this significant problem of reducing the undesirable side reading of a synthetic exchange biased sensor, while retaining the strong coupling between the biasing layer and the free layer which is responsible for the generally excellent performance of the sensor configuration.

SUMMARY OF THE INVENTION

It is a first object of the present invention to provide a magnetically stable synthetic exchange (longitudinally)biased GMR sensor capable of reading high area density magnetic recordings of densities exceeding 60 Gb/in$^2$ (gigabits per square inch).

It is a second object of the present invention to provide such a synthetic exchange biased GMR sensor which has a very narrow trackwidth, typically in a range between 0.05 and 0.20 microns.

It is a third object of the present invention to provide such a synthetic exchange biased GMR sensor having a very narrow trackwidth and in which undesirable side reading is eliminated.

It is a fourth object of the present invention to provide such a synthetic exchange biased GMR sensor having an improved topography.

It is a fifth object of the present invention to provide such a synthetic exchange biased GMR sensor having negative magnetostriction.

It is a sixth object of the present invention to provide such a synthetic exchange biased GMR sensor that is easily fabricated.

It is a seventh object of the present invention to provide such a synthetic exchange biased GMR sensor that can be manufactured within an advantageous process range.

The objects of this invention will be achieved in two embodiments. In the first embodiment, a synthetic exchange (longitudinally) biased GMR sensor will be designed through coherent rotation simulation wherein the biased ferromagnetic free layer (F1) and the ferromagnetic biasing layer (F2) are formed with an optimal ratio of thicknesses. For a given synthetic coupling energy ($J_s$) between F1 and F2 resulting from a non-magnetic spacer layer of given material and thickness and an a given exchange energy ($J_{ex}$) between F2 and an overlaying antiferromagnetic layer of given material and thickness which pins the magnetization direction of F2, this optimum ratio is found to satisfy the relationship between their respective magnetizations (M): $M_{F2}/M_{F1}=(J_s+J_{ex})/J_s$. When formed in accord with this novel, optimized configuration given by this relationship, the sensor is magnetically stable, has an improved overall response, is characterized by significantly reduced undesirable side reading characteristics, has an effectively decreased (by ~30%) trackwidth and can be manufactured within an advantageous process range. Furthermore, the use of the relationship above allows a straightforward calculation of optimal F1 and F2 thicknesses for a wide variety of F1 and F2 materials, a wide variety of antiferromagnetic pinning materials and a wide variety of non-magnetic spacer layers and their thicknesses.

The existence of an optimum thickness ratio is established by means of coherent rotation simulations which study the relationship between the angular displacement of the magnetization of F1 relative to F2 in the conducting lead region as a function of the strength of an applied external magnetic field that is perpendicular to the pinning field. In addition, there is also shown the variation of the magnetoresistance (MR) of the configuration as a function of the same applied field.

In a second embodiment, a novel configuration of a synthetic exchange biased sensor is provided wherein the ferromagnetic biasing layer (F2) is not itself antiferromagnetically pinned by an overlaying antiferromagnetic layer. This novel configuration simplifies the fabrication process of the sensor, improves its topography and, in equal measure to the first embodiment, provides a sensor with highly improved (negative) magnetostriction characteristics.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying figures, wherein:

FIG. 1 is a highly schematic diagram of a prior-art abutted junction GMR sensor stack having a hard magnetic bias layer and conductive lead overlayer in contact with the junction. The diagram is a cross-sectional view of the air bearing surface (ABS) of the sensor. The sensor stack shows only the free layer.

FIG. 2 is a schematic, ABS view, cross-sectional diagram of a prior-art direct exchange biased GMR sensor stack, showing the patterned biasing layers as well as other layers of the sensor.

Figure 3:
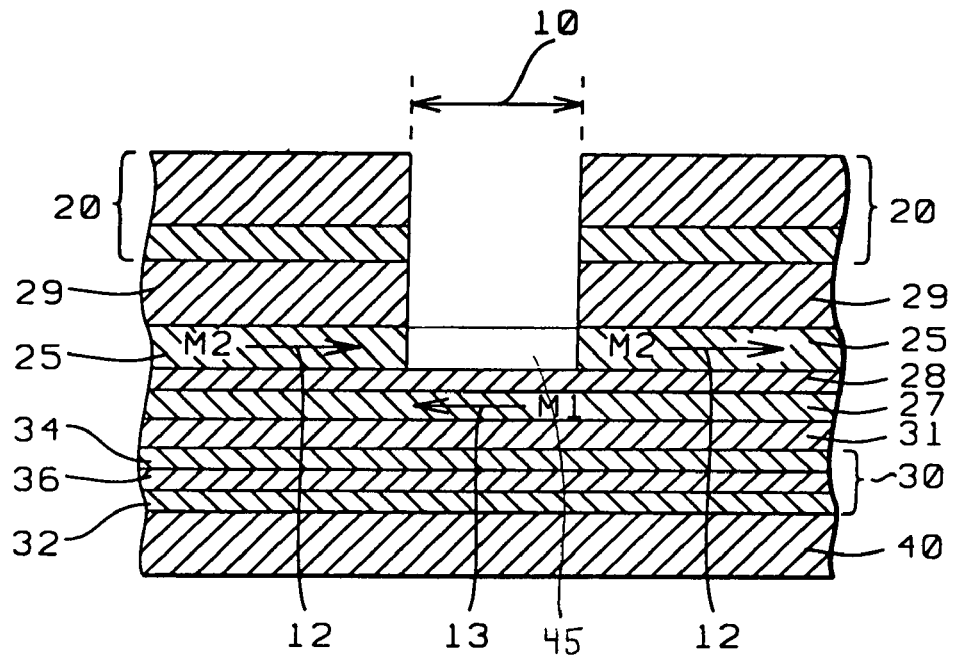
FIG. 3 is a schematic, ABS view, cross-sectional diagram of a synthetic exchange biased GMR sensor stack otherwise identical to the stack in FIG. 2 but which can be optimized in a manner consistent with the objects of the present invention. The general form of this stack, when optimized, will be in accord with the objects of a first embodiment the present invention and possess novel and improved side reading characteristics.

All the simulation results depicted in FIGS. 5–8 were done on the following simulation structure: FM/Cu/F1 (CoFe10/NiFe20)/Ru 7.5/F2(CoFe X)/IrMn, where the numerals represent thicknesses in angstroms and X represents the variable thickness of the F2 layer.

DESCRIPTION OF THE PREFERRED EMBODIMENTS

Referring first to FIG. 1 there is shown a schematic cross-sectional view of the ABS surface of a typical abutted junction GMR sensor designed in accord with the prior art. As can be seen, the narrow trackwidth is obtained at the price of reducing the physical width of the ferromagnetic free layer (10). As a result, the biasing layer (20) pins the magnetization of the free layer and reduces the sensitivity of the sensor.

Referring next to FIG. 2, there is shown a schematic cross-sectional view of the ABS surface of a patterned direct exchange longitudinally biased GMR sensor of the prior art. The physical trackwidth (10) of this configuration is defined by the width of the region between the leads (20), typically a Ta/Au bilayer, and the patterned biasing (25) layers (F2), typically layers of CoFe, which are laterally (ie. in the longitudinal direction) separated along the top of the sensor. The ferromagnetic free layer (F1) (27), typically a CoFe/NiFe bilayer, extends the entire width of the sensor so it is not adversely affected by the strength of the biasing layer, which is a disadvantage of the hard biased abutted junction of FIG. 1. The diagram also shows the antiferromagnetic layer (29), typically a layer of IrMn, which pins the patterned F2 biasing layer (25). The free layer (27) is separated from the biasing layer (25) by a non-magnetic coupling layer (28) which is typically a layer of Cu or Ru and which directly exchange couples the ferromagnetic free layer (27) to the ferromagnetic biasing layer (25) by ferromagnetic coupling to produce parallel magnetizations (11). The remainder of the configuration comprises an antiferromagnetically coupled pinned layer (30), which is comprised of two ferromagnetic layers (AP2 (32) and AP1 (34)) antiferromagnetically exchange coupled across a non-magnetic coupling layer (36) and which is separated from (27) by a non magnetic spacer layer (31). Beneath (30) there is an antiferromagnetic pinning layer (40), typically a layer of MnPt, which pins the antiferromagnetically coupled pinned layer. Since the strength of the ferromagnetic coupling (the pinning field) is weak and is typically less than 250 Oe, it is difficult to achieve a narrow effective trackwidth of less than 0.2 microns. Note that thicknesses are not given for this figure since the configuration is shown for comparison purposes only.

Referring next to FIG. 3, there is shown a schematic cross-sectional view of the ABS surface of a patterned synthetic exchange longitudinally biased GMR sensor whose structure and method of fabrication will be described herein. This structure is similar in many respects to the direct exchange configuration of FIG. 2, except for the antiparallel directions of the F2 and F1 magnetic moments M2 (12), M1 (13). It is this configuration of FIG. 3 which, when properly designed and optimized in accord with the simulations of the present invention, constitutes the first embodiment of the present invention. The following dimensions and method of fabrication however, are not yet in accord with the present invention. As can be seen in FIG. 3, there is first formed an antiferromagnetic pinning layer (40), which can be a layer of antiferromagnetic material chosen from the group of such materials consisting of PtMn, IrMn, NiMn, PdPtMn and FeMn, but which is preferably a layer of PtMn formed to a thickness of 100 angstroms. On this layer is then formed a synthetic antiferromagnetic pinned layer (30), which is a trilayer comprising a first ferromagnetic layer (32), preferably a layer of CoFe formed to a thickness of approximately 15 angstroms, on which is formed a non-magnetic antiferromagnetically coupling layer (34), preferably a layer of Cu formed to a thickness of approximately 18 angstroms, on which is formed a second ferromagnetic layer (36), preferably a layer of CoFe formed to a thickness of approximately 20 angstroms. On the pinned layer is then formed a non-magnetic spacer layer (31), which is preferably a layer of Cu approximately 18 angstroms thick. On this spacer layer is then formed a ferromagnetic free layer (27), which is a bilayer comprising a CoFe layer of preferred thickness 10 angstroms, on which is formed an NiFe layer of preferred thickness 20 angstroms. The remaining layers deposited to complete the formation will not have their thicknesses specified at this point, since the preferred values of those thicknesses will depend on the application of the results of this invention and will be specified in conjunction with the discussion of FIG. 8, below. On the free layer is then formed a non-magnetic antiferromagnetically coupling layer (28), which can be a layer of either Rh or Ru of proper thickness to provide the antiferromagnetic exchange coupling with the biasing layer to be formed. On the coupling layer is formed a ferromagnetic biasing layer (25), preferably a layer of CoFe. On the ferromagnetic biasing layer is formed an antiferromagnetic pinning layer, preferably a layer of IrMn of approximately 40 angstroms thickness. Finally, a conducting lead layer (20) is formed on the pinning layer. At this stage of the fabrication two magnetic annealing processes are carried out, the first being to set the transverse magnetization of the pinned layer (30) and the second being to set the longitudinal magnetization of the free (27) and biasing (25) layers. Following these annealing processes, the physical trackwidth region (10) is formed by a sequence of etches and oxidation processes which leaves the conducting leads (20), the antiferromagnetic pinning layer (25) and the ferromagnetic biasing layer (25) in a patterned configuration. The first etching process is an ion beam etch, which removes the conducting lead layer (20) and the antiferromagnetic pinning layer (29) beneath it in the trackwidth region. A subsequent plasma etch then oxidizes the ferromagnetic biasing layer (25), destroying, thereby, its ferromagnetic properties within the trackwidth region, but leaving it physically present as a layer of oxide (45), which is shown unshaded. The physical trackwidth (10) of this configuration is approximately 0.1 microns and is defined by the width of the region between the leads (20) and patterned biasing (25) layers (F2). Because the ferromagnetic free layer (F1) (27) extends the entire width of the sensor, it is not adversely affected by the strength of the biasing layer as in the case of the hard biased abutted junction of FIG. 1. Unlike the configuration of FIG. 2, the free layer F1 (27) is separated from the biasing layer F2 (25) by a non-magnetic coupling layer (28) which is typically a layer of Cu, Rh or Ru and which has the correct thickness to exchange couple the ferromagnetic free layer (27) to the ferromagnetic biasing layer (25) by antiferromagnetic coupling. A layer of Ru of approximately 7.5 angstroms thickness, for example, is preferable. The remainder of this configuration is the same as in FIG. 2. The strength of the antiferromagnetic coupling (the pinning field) is stronger than the ferromagnetic coupling in FIG. 2 and is typically over 700 Oe. According to our simulations a physical trackwidth of 0.1 microns in the above configuration will produce an effective trackwidth of 0.15 microns because of the undesirable side reading. It is to be noted that the layer thicknesses given above refer to a prior art configuration as does the 0.15 micron effective trackwidth for a 0.1 micron physical trackwidth. Only with the use of the method of the present invention will the significant reduction in effective trackwidth and reduced side reading be obtained. The present invention will provide a novel mechanism for optimizing the thicknesses of F1 and F2 so as to appreciably narrow the effective trackwidth for a given physical trackwidth.

The first embodiment of the present invention will consist of the application to the configuration of FIG. 3 (to which the label numbers below refer), of the novel results of a coherent rotation simulation (FIGS. 5–8 below). These results indicate the existence of an optimal relationship between the thicknesses of F1 (27) and F2 (25), which, when used to form the configuration described in FIG. 3, significantly reduce the side reading propensity of that configuration, thereby effectively narrowing its trackwidth while simultaneously retaining all of the original advantageous properties provided by such a patterned, synthetic exchange biased sensor. This reduced trackwidth is sufficient for reading magnetic recordings with area densities exceeding 60 Gb/in$^2$. The results of the simulation indicate that the thicknesses of F1 and F2 should be chosen so that the relationship between their respective magnetizations $M_{F1}$, $M_{F2}$ satisfy the following equation:

$$M_{F2}/M_{F1}=(J_s+J_{ex})/J_s$$

involving the coupling energy ($J_s$) between F1 and F2 and the exchange energy ($J_{ex}$) between F2 and the overlaying antiferromagnetic layer (29).

Figure 4:
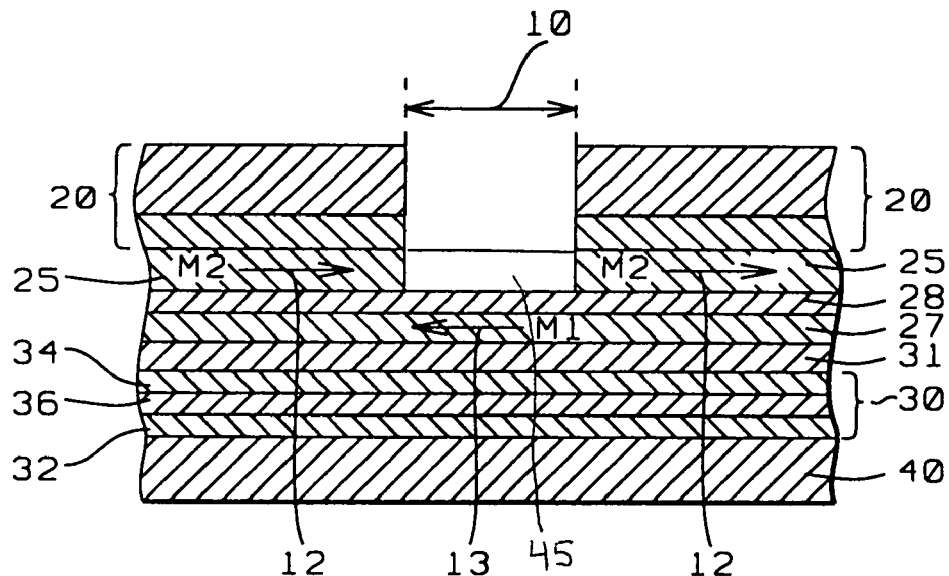
FIG. 4 is a schematic, ABS view, cross-sectional diagram of a synthetic exchange biased GMR sensor stack formed in accord with a second embodiment of the present invention. This stack is structurally different from the stack in FIG. 3 and it can be similarly optimized.
Figure 5A:
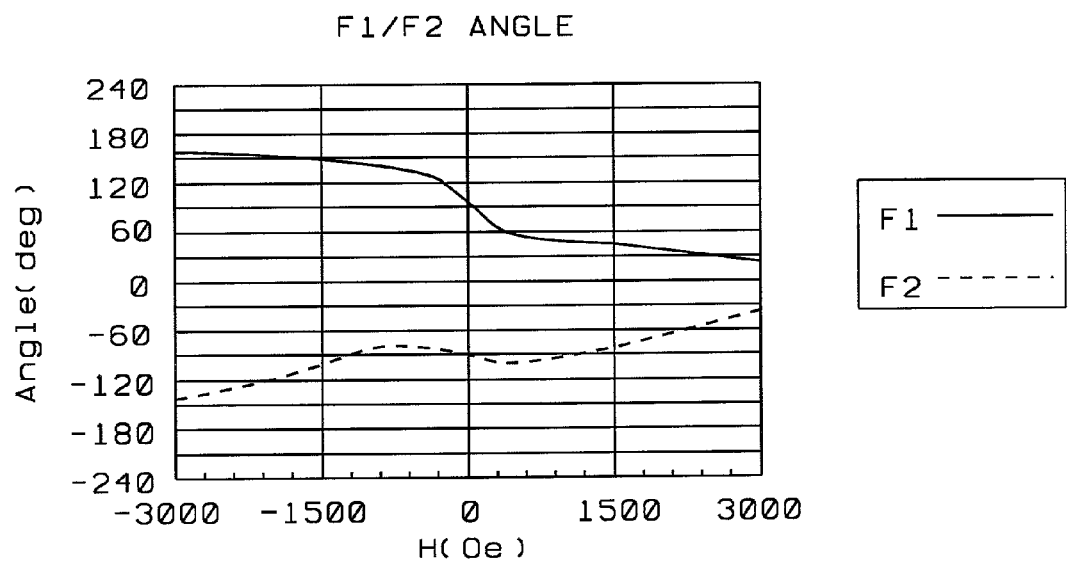
FIGS. 5 A–H is two sets of graphs, showing (A–D) simulated dependencies of the angle between the magnetizations of F1 (free layer) and F2 (biasing layer) on an external field and (E–H) the relationship between the magnetoresistance of the configuaration and the external field. The graphs are for four different values of the thickness of F2.
Figure 5B:
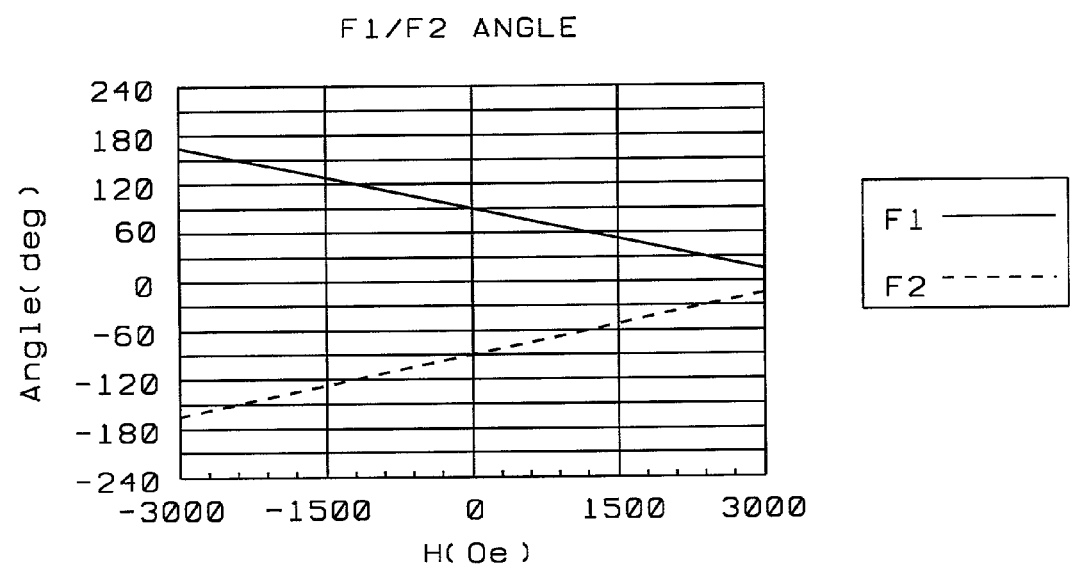
Figure 5C:
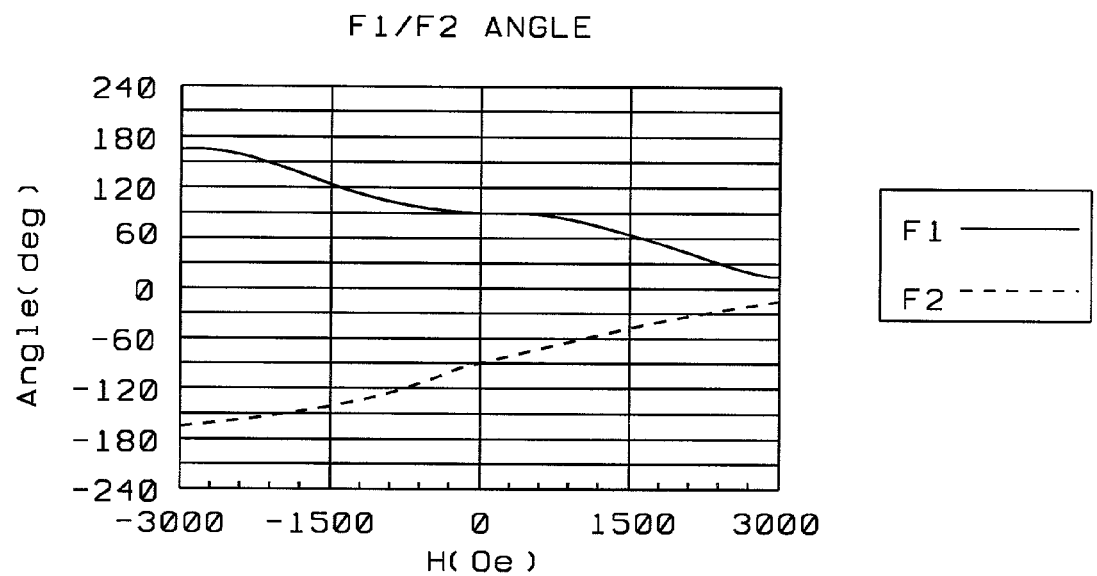
Figure 5D:
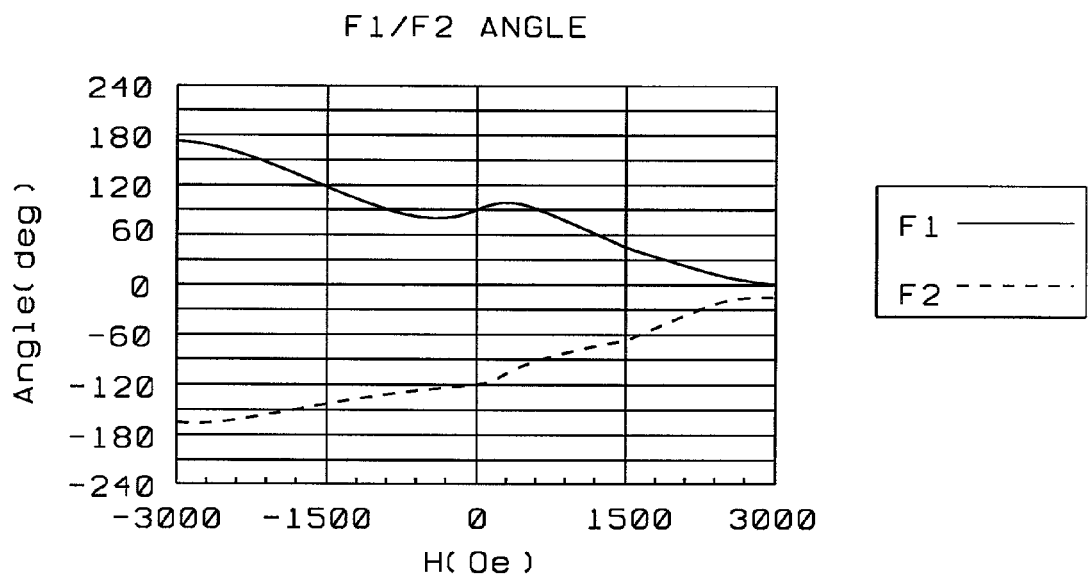
Figure 5E:
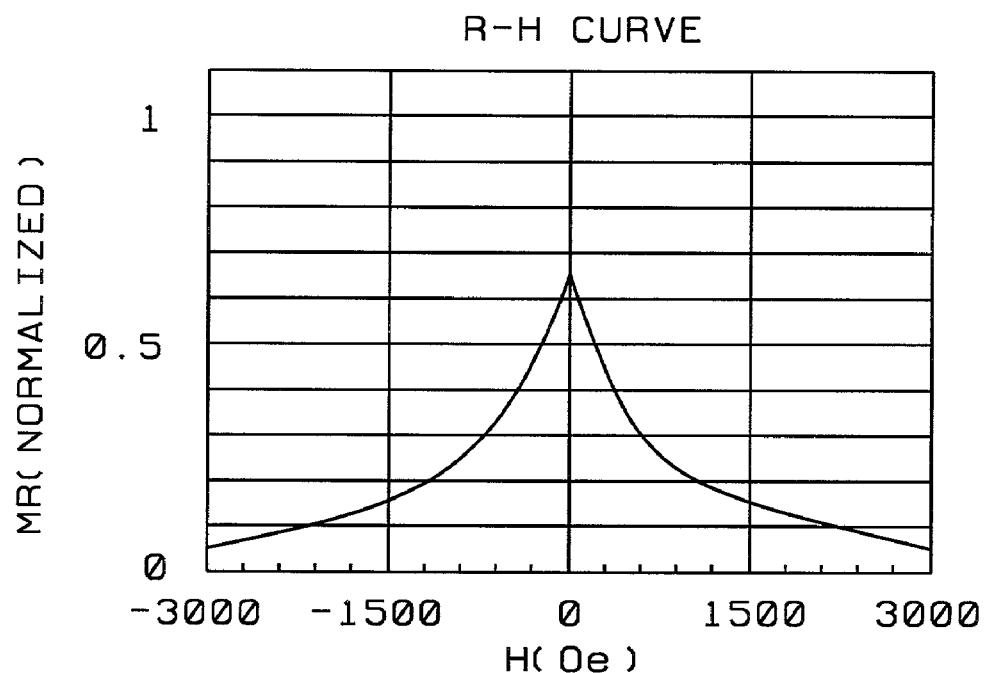
Figure 5F:
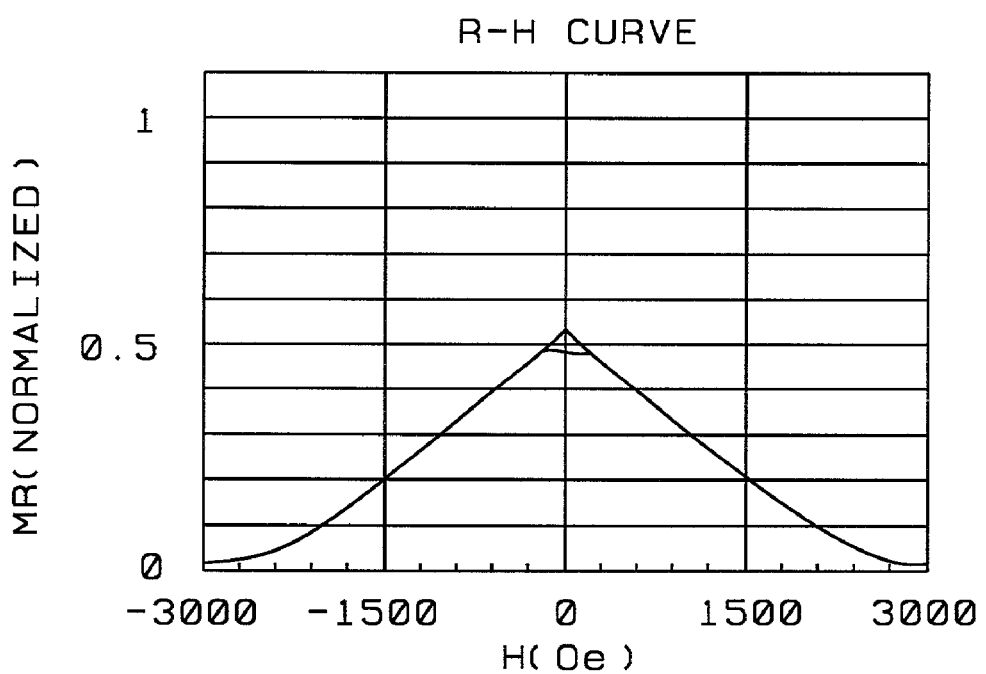
Figure 5G:
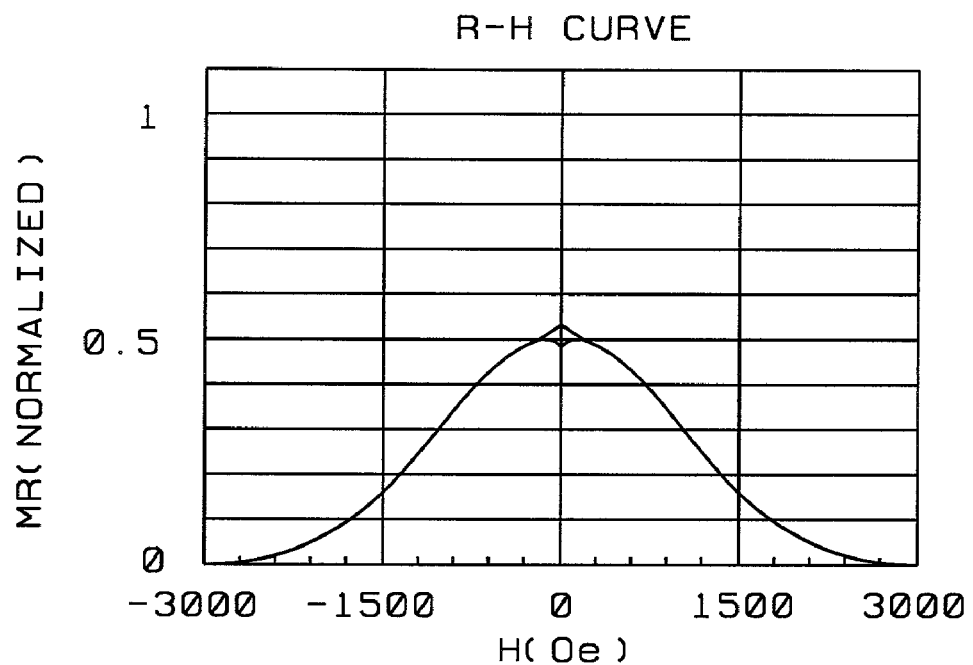
Figure 5H:
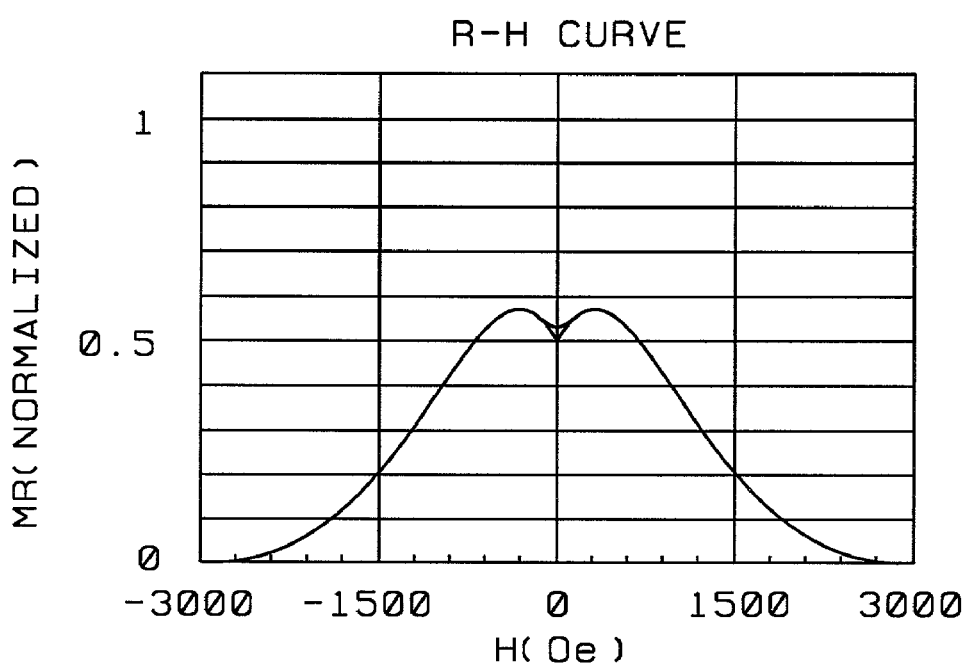

Referring next to FIG. 4, there is shown a schematic cross-sectional view of the ABS surface of a patterned synthetic exchange biased GMR sensor, whose novel configuration provides the second preferred embodiment of this invention. The configuration and its method of formation is similar in all respects to the patterned synthetic exchange configuration of FIG. 3, with the important difference that the biasing layer F2 (25) is not pinned by an antiferromagnetic layer (layer (29) in FIG. 3). The omission of the antiferromagnetic layer simplifies the fabrication process of the sensor, improves its topography and, most significantly, makes the magnetostriction characteristics negative. In the absence of the antiferromagnetic pinning layer the exchange energy term, $J_{ex}$, is zero and the optimization formula becomes:

$$M_{F2}/M_{F2}=(J_s+J_{ex})/J_s+0)/J_s=1,$$

which leads to an optimized thickness ratio, $F_2/F_1$, which is also 1. The F2 biasing layer (25) can be a layer of ferromagnetic material such as CoFe.

Like the configuration of FIG. 3, the ferromagnetic free layer (27), which is typically a layer of CoFe or a bilayer of CoFe and NiFe is separated from the biasing layer (25) by a non-magnetic antiferromagnetically coupling layer (28) which is typically a layer of Cu, Rh or Ru and which exchange couples the ferromagnetic free layer (27) to the ferromagnetic biasing layer (25) by antiferromagnetic coupling. The remainder of this configuration is the same as in FIG. 3 and the various layers are numbered as in FIG. 3.

Referring next to FIGS. 5 A–H, there is shown, two groups of four graphs, generated by micromagnetic simulation. The A–D graphs indicate the variation of the angle between the magnetization (magnetic moment) of F1 and F2 as a function of an externally applied field. The four separate graphs in this figure correspond to four different thicknesses of the biasing layer, F2. The E–H graphs indicate the variation of the magnetoresistance (MR) of the configuration as a function of the same externally applied field. The configuration of layers that is the basis for this simulation is a realistic representation of an actual sensor structure of the type described in FIG. 3, namely:

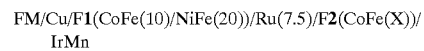

FM/Cu/F1(CoFe(10)/NiFe(20))/Ru(7.5)/F2(CoFe(X))/IrMn

The numbers are thicknesses in angstroms, the "X" in CoFe represents the variable simulation thickness of the F2 layer that is used to distinguish the four graphs, X=15 angstroms, 25 angstroms, 28 angstroms and 35 angstroms. FM, representing a ferromagnetic layer, is used to simplify the simulation. Referring to the figure, it can be seen that with the increase in F2 thickness from 15 to 35 angstroms, the F1 rotation angle under low field first decreases with F2 thickness and reaches a minimum for F2=28 angstroms, then increases again with F2 thickness. For each fixed value of F1, as well as values of $J_{ex}$ and $J_s$, there is an optimum thickness of F2, so different configurations will generally require different optimizations. In the simulated structure above, $J_s$=0.25 erg/cm$^2$ and $J_{ex}$=0.1 erg/cm$^2$. It is to be noted that the IrMn layer would be absent in the second embodiment of FIG. 4

Figure 6:
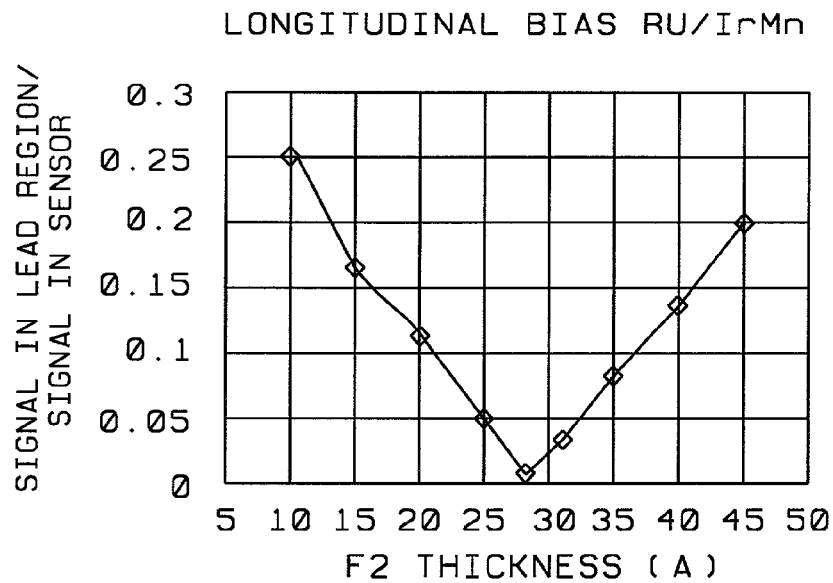
FIG. 6 is a graph showing the simulated response of the F1 signal at the region of the conductive leads as a function of F2 thickness.

Referring next to FIG. 6, there is shown a graph relating F2 thickness to the relative sensor signal produced by only the lead region of the free layer, the portion of F1 that is beneath the lead layer and, therefore, outside of the physical trackwidth. Since the reduction of effective trackwidth is a result of eliminating, to as great a degree as possible, undesirable signals emanating from that portion of the free layer, it is critical to demonstrate that such signal reduction is possible and can be optimized. As seen in the graph, there is a distinct minimum at around 28 angstroms thickness of F2. The simulation producing the graph assumed a 400 Oe field in the lead region of F1. An observation of the graph also shows that if F2 is in the thickness range of 22 to 34 angstroms, the signal contribution of the lead region can be reduced by more than a factor of three. The results compiled in Table 1 (below) also indicate that the 25 angstrom and 28 angstrom F2 thicknesses have very similar effective trackwidths. This indicates that there is a window of thicknesses (an F2/F1 ratio of between 1.1 and 1.7) about the optimal thickness which are equally advantageous for sensor formation.

Figure 7:
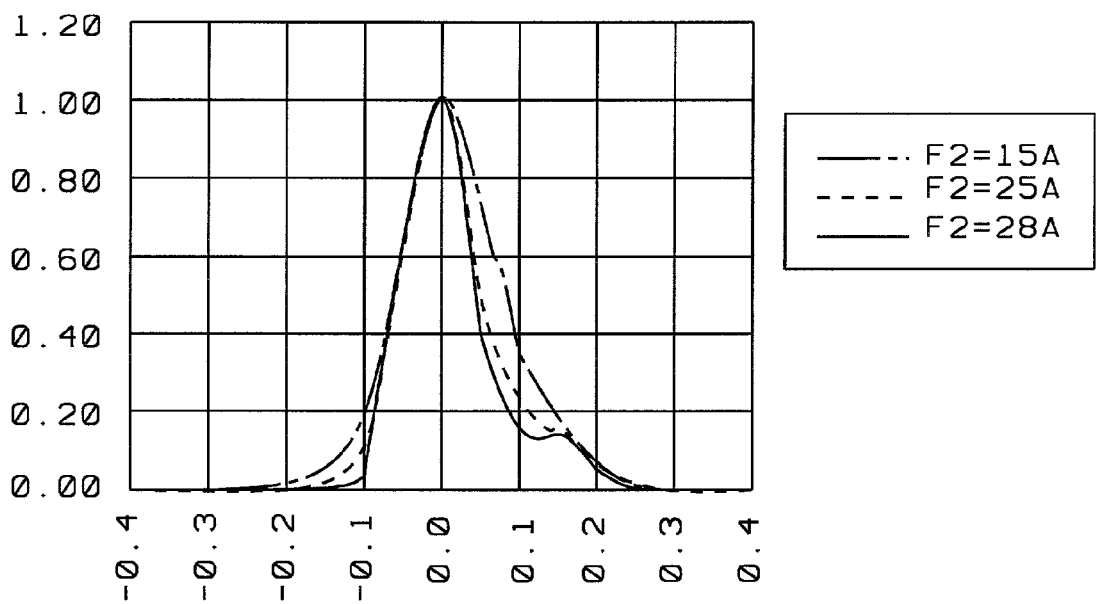
FIG. 7 is a graph showing the results of simulating the response of F1 along its length as a function of F2 thickness.

Referring finally to FIG. 7, there is shown the superposition of three graphs that plot normalized sensor output as a function of position along the physical trackwidth of the sensor (0.1 micron). For the purposes of this simulation, the configuration was the following.

In the lead region:

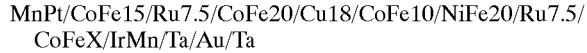

MnPt/CoFe15/Ru7.5/CoFe20/Cu18/CoFe10/NiFe20/Ru7.5/CoFeX/IrMn/Ta/Au/Ta

In the sensor region:

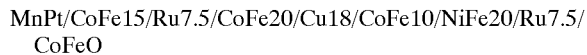

MnPt/CoFe15/Ru7.5/CoFe20/Cu18/CoFe10/NiFe20/Ru7.5/CoFeO

The three graphs correspond to different F2 thickness: X=15, 25 and 28 angstroms. As can be seen in the figure, the trackwidth becomes narrower with increasing F2 thickness and the graph for X=28 angstroms is both narrowest and smoothest.

The results of the modeling are summarized in Table 1 below.

TABLE 1

| Configuration (angstroms) | $J_s$ erg/cm$^2$ | $J_{ex}$ | Effective Trackwidth ($\mu$m) |
|---|---|---|---|
| CoFe10/NiFe20/Ru7.5/CoFe15/IrMn40 | 0.25 | 0.1 | 0.15 |
| CoFe10/NiFe20/Ru7.5/CoFe25/IrMn40 | 0.25 | 0.1 | 0.12 |
| CoFe10/NiFe20/Ru7.5/CoFe25/IrMn40 | 0.25 | 0.1 | 0.11 |

With a different nonmagnetic spacer layer and/or a different antiferromagnetic pinning layer $J_s$ and $J_{ex}$ would change and the thickness of F2 would have to be recalculated for optimality. It is found that for a given configuration with fixed $J_s$ and $J_{ex}$ the minimum F1 rotation can be obtained when the ratio of F1/F2 magnetic moments is given by:

$$M_{F2}/M_{F1}=(J_s+J_{ex})/J_s$$

An example of the variation of F2 thickness required to obtain minimum effective trackwidth for two different non-magnetic spacer layers and F1 having a magnetization equivalent to 20 angstroms of CoFe is given in Table 2.

TABLE 2

| Structure | $J_s$ (erg/cm$^2$) | $J_s$ (erg/cm$^2$) | F2 thickness | $H_{pin}$ (Oe) |
|---|---|---|---|---|
| CoFe10/NiFe20/Ru7.5/F2/IrMn40 | 0.25 | 0.1 | 28 | 900 |
| CoFe10/NiFe20/Rh5/F2/IrMn40 | 0.75 | 0.1 | 22.6 | 2500 |

The synthetic bias scheme of this embodiment can be a variety of combinations of materials for the antiferromagnetic layer that pins F2 (eg. NiMn, PtMn, PdPtMn, FeMn, IrMn), the non-magnetic spacer layer that couples F1 to F2 (eg. Cu, Rh, Ru, Ir, Cr) and the ferromagnetic free layer F1 (eg. CoFe, CoFe/NiFe, CoFeNi, NiFe). Knowledge of $J_s$ and $J_{ex}$ which would be obtained from experiment, and the use of the relationship $M_{F2}/M_{F1}=(J_s+J_{ex})/J_s$ (or, $M_{F2}/M_{F1}=1$, for the second embodiment) allows a straightforward determination of optimal thicknesses for F1 and F2.

Figure 8:
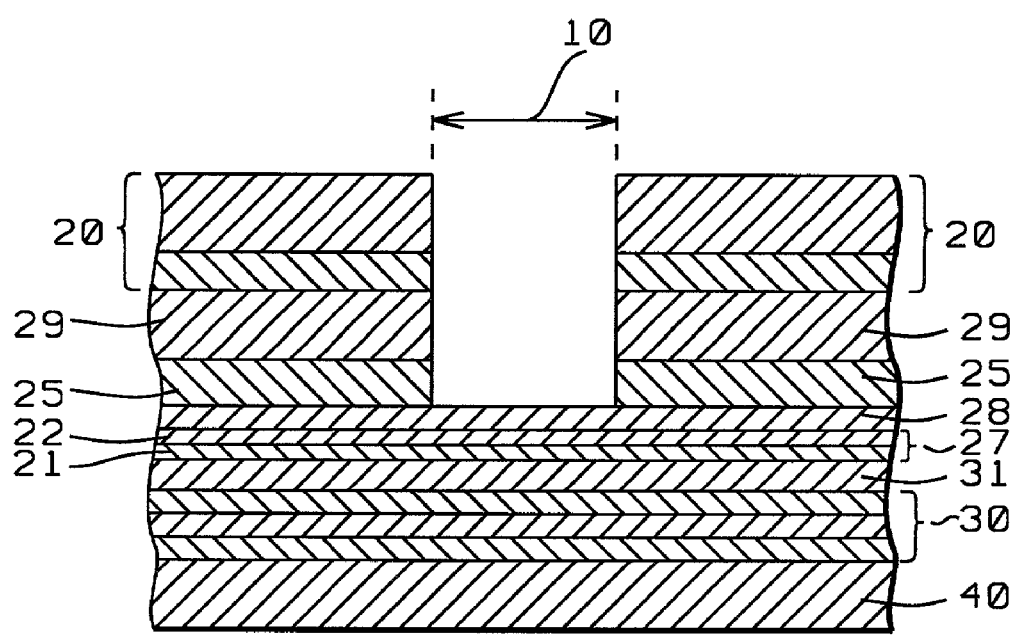
FIG. 8 is the sensor of FIG. 3 now formed in accord with the method of the present invention, i.e., wherein the F1 and F2 layers have the thicknesses prescribed by the optimization procedure.

Referring now to FIG. 8 there is shown the first preferred embodiment of this invention, which is the formation of the structure in FIG. 3, using the method of formation described in connection with the discussion of FIG. 3 and, in addition, applying the results of the simulations described in FIGS. 5–7, Tables 1 and 2 and the formula $M_{F2}/M_{F1}=(J_s+J_s)/J_s$. In FIG. 8 there is shown, therefore, the structure of FIG. 3, wherein the dimensions of the F1 and F2 layers and their material composition are as follows. It is further understood that if the objects and advantages of the present invention are to be obtained, the determination of F2 and F1 dimensions must be calculated anew for each choice of their material composition and the values of $J_s$ and $J_{ex}$ resulting from the various possible coupling layers and pinning layers. In the present figure, however, the free layer (27) is a bilayer of CoFe/NiFe, wherein the CoFe (21) has a thickness between approximately 3 and 20 angstroms, with 10 angstroms being the preferred value and the NiFe (22) has a thickness between 40 and 10 angstroms, with 20 angstroms being the preferred value. Within this range of values, the biasing layer, F2, (27) is a layer of CoFe of thickness range between approximately 22 angstroms and 34 angstroms, with 28 angstroms being the preferred value and the non-magnetic coupling layer (28) is a layer of Ru of thickness between approximately 2 angstroms and 9 angstroms, with 7.5 angstroms being preferable. Alternatively, if the non-magnetic coupling layer (28) is a layer of Rh of thickness between approximately 3 and 6 angstroms, with 5 angstroms being preferable, the F2 layer (27) would be a layer of CoFe of thickness between approximately 18.6 angstroms and 26.6 angstroms, with 22.6 angstroms being preferable. The pinning layer of IrMn (29) is in the thickness range between approximately 25 angstroms and 100 angstroms. In the second embodiment, which would be the application to the structure of FIG. 4 as formed in accord with the given description, the relationship $M_{F2}/M_{F1}=1$, the optimization the dimensional ranges of layer F1 remain approximately the same as in the first embodiment, while the thickness of the F2 layer, which is a layer of CoFe, is between approximately 10 angstroms and 20 angstroms with 15 angstroms being preferred. All other layers, methods and dimensions would be the same as those of FIG. 3.

As is understood by a person skilled in the art, the preferred embodiment of the present invention is illustrative of the present invention rather than limiting of the present invention. Revisions and modifications may be made to methods, materials, structures and dimensions employed in fabricating a synthetic, patterned, longitudinally exchange biased GMR sensor with narrow effective trackwidth and reduced side reading, while still providing a method for fabricating such a synthetic, patterned, longitudinally exchange biased GMR sensor with narrow effective trackwidth and reduced side reading, in accord with the spirit and scope of the present invention as defined by the appended claims.

What is claimed is:

1. A method for fabricating a synthetic, patterned, longitudinally exchange biased GMR sensor with narrow effective trackwidth comprising:

providing a substrate;

forming a seed layer on said substrate;

forming a first layer of antiferromagnetic material on the seed layer, said layer of antiferromagnetic material being a pinning layer;

forming a synthetic antiferromagnetic pinned layer on said first antiferromagnetic pinning layer;

forming a non-magnetic spacer layer on said pinned layer;

forming a ferromagnetic free layer of thickness F1 and magnetic moment $M_{F1}$ on said non-magnetic spacer layer;

forming a non-magnetic antiferromagnetically coupling layer on said ferromagnetic free layer;

forming a ferromagnetic, longitudinal biasing layer of thickness F2, and magnetic moment $M_{F2}$ on said coupling layer, producing thereby a coupling energy $J_s$ and an exchange energy $J_{ex}$, and wherein the thicknesses F1 and F2 will be determined so that a ratio of the respective magnetic moments $M_{F2}/M_{F1}$ satisfy a relationship $M_{F2}/M_{F1}=(J_s+J_{ex})/J_s$;

forming a second antiferromagnetic pinning layer on said longitudinal biasing layer;

forming a conductive lead layer on said antiferromagnetic layer;

annealing the resulting structure with a first anneal for a first annealing time, at a first annealing temperature and in a first external magnetic field;

annealing the resulting structure with a second anneal for a second annealing time, at a second annealing temperature and in a second external magnetic field;

removing, by an etching process, a central portion of said conductive lead layer and the portion of said second antiferromagnetic pinning layer directly beneath said central portion, exposing, thereby, an upper surface of said longitudinal biasing layer beneath said pinning layer and forming, thereby, two discrete, disconnected and laterally separated segments, laterally and symmetrically disposed to either side of said longitudinal biasing layer and separated by the desired physical trackwidth of said sensor;

oxidizing the exposed portion of said ferromagnetic longitudinal biasing layer, said oxidation extending the entire width and thickness of said exposed portion and destroying the ferromagnetic properties of said layer and said oxidation being stopped by the upper surface of said non-magnetic antiferromagnetically coupling layer.

2. The method of claim 1 wherein the ferromagnetic free layer is a bilayer comprising a first ferromagnetic layer on which is formed a second ferromagnetic layer wherein said first ferromagnetic layer is a layer of ferromagnetic material chosen from the group consisting of CoFe, NiFe and CoFeNi and wherein said second ferromagnetic layer is a layer of ferromagnetic material chosen from the group consisting of CoFe, NiFe and CoFeNi.

3. The method of claim 1 wherein the ferromagnetic free layer is a bilayer comprising a layer of CoFe of thickness between approximately 3 and 15 angstroms, where approximately 10 angstroms is preferred, on which is formed a layer of NiFe of thickness between approximately 10 and 40 angstroms, where approximately 20 angstroms is preferred.

4. The method of claim 1 wherein the non-magnetic antiferromagnetically coupling layer is a layer of non-magnetic material chosen from the group consisting of Cu, Ru and Rh.

5. The method of claim 1 wherein the non-magnetic antiferromagnetically coupling layer is a layer of Ru formed to a thickness of between approximately 2 and 9 angstroms, where approximately 7.5 angstroms is preferred.

6. The method of claim 1 wherein the non-magnetic antiferromagnetically coupling layer is a layer of Rh formed to a thickness of between approximately 3 and 6 angstroms, where approximately 5 angstroms is preferred.

7. The method of claim 5 wherein the ferromagnetic biasing layer is a layer of CoFe formed to a thickness between approximately 22 angstroms and 34 angstroms with approximately 28 angstroms being preferred.

8. The method of claim 6 wherein the ferromagnetic biasing layer is a layer of CoFe formed to a thickness between approximately 18.6 angstroms and 26.6 angstroms with approximately 22.6 angstroms being preferred.

9. The method of claim 7 wherein the second antiferromagnetic layer is a layer of IrMn formed to a thickness between approximately 25 and 100 angstroms, where approximately 40 angstroms is preferred.

10. The method of claim 8 wherein the second antiferromagnetic layer is a layer of IrMn formed to a thickness between approximately 25 and 100 angstroms, where approximately 40 angstroms is preferred.

11. The method of claim 1 wherein the values of $M_{F1}$, $M_{F2}$, $J_s$ and $J_{ex}$ are determined by coherent rotation simulation.

12. The method of claim 1 wherein the values of $M_{F1}$, $M_{F2}$, $J_s$ and $J_{ex}$ are determined by experiment.

13. A method for fabricating a synthetic, patterned, longitudinally exchange biased GMR sensor with narrow effective trackwidth comprising:

providing a substrate;
forming a seed layer on said substrate;
forming a first layer of antiferromagnetic material on the seed layer, said layer of antiferromagnetic material being a pinning layer;
forming a synthetic antiferromagnetic pinned layer on said first antiferromagnetic pinning layer;
forming a non-magnetic spacer layer on said pinned layer;
forming a ferromagnetic free layer of thickness F1 and magnetic moment $M_{F1}$ on said non-magnetic spacer layer;
forming a non-magnetic antiferromagnetically coupling layer on said ferromagnetic free layer;
forming a ferromagnetic, longitudinal biasing layer of thickness F2, and magnetic moment $M_{F2}$ on said coupling layer, producing thereby a coupling energy $J_s$, and wherein the thicknesses F1 and F2 will be determined so that a ratio of the respective magnetic moments $M_{F2}/M_{F1}$ satisfy a relationship $M_{F2}/M_{F1}=1$;
forming a conductive lead layer on said longitudinal biasing layer;
annealing the resulting structure with a first anneal for a first annealing time, at a first annealing temperature and in a first external magnetic field;
annealing the resulting structure with a second anneal for a second annealing time, at a second annealing temperature and in a second external magnetic field;
removing, by an etching process, a central portion of said conductive lead layer, exposing, thereby, an upper surface of said longitudinal biasing layer beneath said pinning layer and forming, thereby, two discrete, disconnected and laterally separated segments, laterally and symmetrically disposed to either side of said longitudinal biasing layer and separated by the desired physical trackwidth of said sensor;
oxidizing the exposed portion of said ferromagnetic longitudinal biasing layer, said oxidation extending the entire width and thickness of said exposed portion and destroying the ferromagnetic properties of said layer and said oxidation being stopped by the upper surface of said non-magnetic antiferromagnetically coupling layer.

14. The method of claim 13 wherein the ferromagnetic free layer is a bilayer comprising a first ferromagnetic layer on which is formed a second ferromagnetic layer wherein said first ferromagnetic layer is a layer of ferromagnetic material chosen from the group consisting of CoFe, NiFe and CoFeNi and wherein said second ferromagnetic layer is a layer of ferromagnetic material chosen from the group consisting of CoFe, NiFe and CoFeNi.

15. The method of claim 13 wherein the ferromagnetic free layer is a bilayer comprising a layer of CoFe of thickness between approximately 3 and 15 angstroms, where approximately 10 angstroms is preferred, on which is formed a layer of NiFe of thickness between approximately 10 and 40 angstroms, where approximately 20 angstroms is preferred.

16. The method of claim 13 wherein the non-magnetic antiferromagnetically coupling layer is a layer of non-magnetic material chosen from the group consisting of Cu, Ru and Rh.

17. The method of claim 13 wherein the non-magnetic antiferromagnetically coupling layer is a layer of Ru formed to a thickness of between approximately 2 and 9 angstroms, where approximately 7.5 angstroms is preferred.

18. The method of claim 13 wherein the non-magnetic antiferromagnetically coupling layer is a layer of Rh formed to a thickness of between approximately 3 and 6 angstroms, where approximately 5 angstroms is preferred.

19. The method of claim 17 wherein the ferromagnetic biasing layer is a layer of CoFe formed to a thickness between approximately 22 angstroms and 34 angstroms with approximately 28 angstroms being preferred.

20. The method of claim 18 wherein the ferromagnetic biasing layer is a layer of CoFe formed to a thickness between approximately 18.6 angstroms and 26.6 angstroms with approximately 22.6 angstroms being preferred.

* * * * *